(12) United States Patent
Yu et al.

(10) Patent No.: US 12,132,249 B2
(45) Date of Patent: Oct. 29, 2024

(54) ANTENNA MODULE, ANTENNA MODULE MANUFACTURING METHOD, AND ELECTRONIC DEVICE

(71) Applicant: HUAWEI TECHNOLOGIES CO., LTD., Guangdong (CN)

(72) Inventors: Rui Yu, Shanghai (CN); Hsiang Hui Chang, Shenzhen (CN); Wenping Jia, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 204 days.

(21) Appl. No.: 17/916,034

(22) PCT Filed: Mar. 3, 2021

(86) PCT No.: PCT/CN2021/078908
§ 371 (c)(1),
(2) Date: Sep. 30, 2022

(87) PCT Pub. No.: WO2021/203874
PCT Pub. Date: Oct. 14, 2021

(65) Prior Publication Data
US 2023/0170602 A1     Jun. 1, 2023

(30) Foreign Application Priority Data

Apr. 10, 2020   (CN) .......................... 202010280737.9

(51) Int. Cl.
*H01Q 1/22*   (2006.01)
*H01L 21/56*   (2006.01)
(Continued)

(52) U.S. Cl.
CPC .......... *H01Q 1/2283* (2013.01); *H01L 21/56* (2013.01); *H01L 23/3128* (2013.01);
(Continued)

(58) Field of Classification Search
CPC ... H01Q 1/2283; H01L 21/56; H01L 23/3128; H01L 23/49822; H01L 23/49827; H01L 23/49838; H01L 23/4985
See application file for complete search history.

(56) References Cited

U.S. PATENT DOCUMENTS

2002/0094639 A1   7/2002   Reddy
2019/0036229 A1   1/2019   Kim et al.
(Continued)

FOREIGN PATENT DOCUMENTS

| CN | 101179068 A | 5/2008 |
|---|---|---|
| CN | 110024114 A | 7/2019 |
| CN | 110565123 A | 12/2019 |

*Primary Examiner* — Graham P Smith
(74) *Attorney, Agent, or Firm* — HUAWEI TECHNOLOGIES CO., LTD.

(57) ABSTRACT

An antenna module includes: a first insulation medium substrate, including a first section provided with a first groove and a second section, where an integrated circuit is disposed in the first groove; a flexible substrate including a conductive structure, where the flexible substrate is stacked on the first insulation medium substrate, and a part that is of the flexible substrate and that is located between the first section and the second section is bendable; and an antenna structure, including a first metal structure that is disposed on the first section and that is connected to the conductive structure and the integrated circuit, and a second metal structure that is disposed on the second section and that is connected to the conductive structure. This avoids a warping problem caused by different thermal expansion coefficients of a plastic packaging material and a substrate, and reduces a risk of product failure.

20 Claims, 14 Drawing Sheets

(51) Int. Cl.
*H01L 23/31* (2006.01)
*H01L 23/498* (2006.01)

(52) U.S. Cl.
CPC .. *H01L 23/49822* (2013.01); *H01L 23/49827* (2013.01); *H01L 23/49838* (2013.01); *H01L 23/4985* (2013.01)

(56) References Cited

U.S. PATENT DOCUMENTS

2019/0103653 A1 4/2019 Jeong et al.
2019/0296209 A1 9/2019 Kasichainula

ANTENNA MODULE, ANTENNA MODULE MANUFACTURING METHOD, AND ELECTRONIC DEVICE

CROSS-REFERENCE TO RELATED APPLICATIONS

This application is a national stage of International Application No. PCT/CN2021/078908, filed on Mar. 3, 2021, which claims priority to Chinese Patent Application No. 202010280737.9 filed on Apr. 10, 2020. Both of the aforementioned applications are hereby incorporated by reference in their entireties.

TECHNICAL FIELD

This application relates to the field of communication technologies, and in particular, to an antenna module, an antenna module manufacturing method, and an electronic device.

BACKGROUND

An antenna in package (Antenna in Package, AiP) mainly includes an antenna, a radio frequency chip, and a substrate. The antenna is disposed on a first surface of the substrate. The radio frequency chip is attached to a second surface of the substrate by using a solder ball, and is connected to the antenna by using a circuit inside the substrate. During plastic packaging protection, due to different thermal expansion coefficients of a plastic packaging material and the substrate, a warping phenomenon is likely to occur. As a result, subsequent processes such as packaging and connecting to a PCB board are difficult to implement, and there is a high risk of product failure. In addition, a shield layer is usually formed by electroplating metal outside a plastic packaging layer, to prevent electromagnetic interference. However, fabrication processes, such as a process of sputtering metal and a process of electroplating metal, of the shield layer are complex and expensive. As a result, it is rather difficult to process and the processing is time-consuming. This is not conducive to reducing costs. Further, because a planar structure of the substrate limits a coverage direction of an antenna pattern arranged on the substrate, a single antenna in package cannot simultaneously implement excellent gains on a front and a side of a terminal device. To be specific, the antenna can be implemented only in a direction of a substrate plane parallel to the radio frequency chip, and a gain effect of the antenna in another direction is relatively poor.

SUMMARY

To overcome the foregoing problems in a conventional technology, this application provides an antenna module, an antenna module manufacturing method, and an electronic device. There is no need to perform a plastic packaging process. This avoids a warping problem caused by different thermal expansion coefficients of a plastic packaging material and a substrate, and reduces a risk of product failure. In addition, signal coverage in more directions can be implemented, and no limitation is imposed on a shape of an antenna structure. Therefore, an antenna structure with a high gain can be fabricated.

In view of this, the following technical solutions are used in embodiments of this application.

According to a first aspect, an embodiment of this application provides an antenna module, where the antenna module includes an integrated circuit, configured to generate a radio frequency signal; a first insulation medium substrate, including a first section provided with a first groove and a second section spaced from the first section, where the integrated circuit is disposed in the first groove; a flexible substrate, stacked on the first insulation medium substrate, where a middle part that is of the flexible substrate and that is located between the first section and the second section is bendable, and the flexible substrate includes a conductive structure; and an antenna structure, including a first metal structure disposed on the first section and a second metal structure disposed on the second section, where the first metal structure is connected to the conductive structure and the integrated circuit, and the second metal structure is connected to the conductive structure.

Optionally, the antenna structure is formed by plating copper on an outer surface and an interior of the first insulation medium substrate, and is connected to the integrated circuit.

Optionally, a second groove is provided on the flexible substrate, the second groove is arranged opposite to the first groove, and the integrated circuit is disposed in the first groove and the second groove.

Optionally, the flexible substrate further includes a substrate film, the conductive structure includes a first metal layer and a second metal layer disposed on both sides of the substrate film, and a connection metal layer disposed through the substrate film, and the connection metal layer connects the first metal layer and the second metal layer.

Optionally, a first protective layer is disposed on an outer surface that is of the conductive structure of the flexible substrate and on which no other structure is stacked.

Optionally, the first insulation medium substrate includes a first-layer substrate, and the first groove and a first through hole are provided on the first-layer substrate; the first metal structure includes a first metal layer disposed on an outer surface of the first section of the first-layer substrate, and a first connection part that is disposed in the first through hole and that connects the first metal layer and the conductive structure of the flexible substrate; and the second metal structure includes a first metal layer disposed on an outer surface of the second section of the first-layer substrate, and a first connection part that is disposed in the first through hole and that connects the first metal layer and the conductive structure of the flexible substrate.

Optionally, the first insulation medium substrate includes a second-layer substrate stacked on a side that is of the first-layer substrate and that is away from the flexible substrate, the first metal layer is disposed on the second-layer substrate, and a second through hole is provided on the second-layer substrate; the first metal structure further includes a second metal layer disposed on the outer surface of the first section of the second-layer substrate, and a second connection part that is disposed in the second through hole and that connects the second metal layer and the first metal layer; and the second metal structure further includes a second metal layer disposed on the outer surface of the second section of the second-layer substrate, and a second connection part that is disposed in the second through hole and that connects the second metal layer and the first metal layer.

Optionally, the antenna module includes a second insulation medium substrate disposed on a side that is of the flexible substrate and that is away from the first insulation medium substrate, and the second insulation medium substrate includes: a third section disposed corresponding to the first section, where a third metal structure connected to the conductive structure of the flexible substrate is disposed on the third section, and the antenna structure further includes the third metal structure; and/or a fourth section disposed corresponding to the second section, where a fourth metal structure connected to the conductive structure of the flexible substrate is disposed on the fourth section, and the antenna structure further includes the fourth metal structure.

Optionally, a third through hole is provided on the second insulation medium substrate; the third metal structure includes a third metal layer located on an outer surface of the third section of the second insulation medium substrate, and a third connection part that is disposed in the third through hole and that connects the third metal layer and the conductive structure of the flexible substrate; and/or the fourth metal structure includes a third metal layer located on an outer surface of the fourth section of the second insulation medium substrate, and a third connection part that is disposed in the third through hole and that connects the third metal layer and the conductive structure of the flexible substrate.

Optionally, a second protective layer is disposed on outer surfaces that are of the third metal structure and/or the fourth metal structure, and the second insulation medium substrate and that are away from the flexible substrate.

Optionally, a second protective layer is disposed on outer surfaces that are of the first metal structure, the second metal structure, and the first insulation medium substrate and that are away from the flexible substrate.

Optionally, a slot for exposing a part of the first metal structure is provided on the second protective layer, and solder connected to the exposed first metal structure is disposed in the slot.

Optionally, one end of the flexible substrate is disposed to extend out of the first section, an extended part of the flexible substrate is bendable, and a connector is connected to the conductive structure at the extended part.

Optionally, the integrated circuit includes at least one of a radio frequency chip and a power management chip.

According to a second aspect, an embodiment of this application provides an electronic device, including the antenna module according to the first aspect.

According to a third aspect, an embodiment of this application provides an antenna module manufacturing method. The manufacturing method includes: cutting a first insulation medium substrate into a first section and a second section spaced from each other, and providing a first groove on the first section; disposing an integrated circuit in the first groove; stacking a flexible substrate with a conductive structure on the first section and the second section; and disposing a first metal structure on the first section and disposing a second metal structure on the second section, where the first metal structure is connected to the conductive structure and the integrated circuit, the second metal structure is connected to the conductive structure, and an antenna structure includes the first metal structure and the second metal structure.

Optionally, before the step of stacking a flexible substrate on the first section and the second section, a second groove is provided on the flexible substrate and a first protective layer is disposed on an outer surface that is of the conductive structure of the flexible substrate and on which no other structure is stacked. When the flexible substrate is stacked on the first section and the second section, the second groove is enabled to be opposite to the first groove, and the integrated circuit is placed in the first groove and the second groove.

Optionally, the antenna structure is formed by plating copper on an outer surface and an interior of the first insulation medium substrate, and is connected to the integrated circuit.

Optionally, the manufacturing method includes: stacking a third section that is of the second insulation medium substrate and that corresponds to the first section on the flexible substrate, and disposing a third metal structure on the third section, where the third metal structure is connected to the conductive structure of the flexible substrate, and the antenna structure further includes the third metal structure; and/or stacking a fourth section that is of the second insulation medium substrate and that corresponds to the second section on the flexible substrate, and disposing a fourth metal structure on the fourth section, where the fourth metal structure is connected to the conductive structure of the flexible substrate, and the antenna structure further includes the fourth metal structure.

Optionally, the manufacturing method includes: disposing a second protective layer on outer surfaces that are of the third metal structure and/or the fourth metal structure, and the second insulation medium substrate and that are away from the flexible substrate.

Optionally, the first insulation medium substrate includes a first-layer substrate on which the first groove is provided. The disposing a first metal structure on the first section and disposing a second metal structure on the second section includes: providing a first through hole on the first-layer substrate; disposing a first metal layer on an outer surface of the first section of the first-layer substrate, and disposing, in the first through hole, a first connection part that connects the first metal layer and the conductive structure, where the first metal structure includes the first metal layer and the first connection part; and disposing a first metal layer on an outer surface of the second section of the first-layer substrate, and disposing, in the first through hole, a first connection part that connects the first metal layer and the conductive structure, where the second metal structure includes the first metal layer and the first connection part.

Optionally, the first insulation medium substrate further includes a second-layer substrate. The disposing a first metal structure on the first section and disposing a second metal structure on the second section further includes: providing a second through hole on the second-layer substrate; performing a press-fit on the second-layer substrate to a side that is of the first-layer substrate and on which the first metal layer is disposed; disposing a second metal layer on an outer surface of the first section of the second-layer substrate, and disposing, in the second through hole, a second connection part that connects the first metal layer and the second metal layer, where the first metal structure further includes the second metal layer and the second connection part; and disposing a second metal layer on an outer surface of the second section of the second-layer substrate, and disposing, in the second through hole, a second connection part that connects the first metal layer and the second metal layer, where the second metal structure further includes the second metal layer and the second connection part.

Optionally, the manufacturing method includes: disposing a second protective layer on outer surfaces that are of the first metal structure, the second metal structure, and the first insulation medium substrate and that are away from the flexible substrate.

Optionally, the manufacturing method includes: providing, on the second protective layer located in the first section, a slot for exposing a part of the first metal structure; and disposing, at the slot, solder connected to the exposed first metal structure.

In the foregoing technical solutions, the first groove is provided on the first insulation medium substrate, and the integrated circuit (for example, the radio frequency chip and/or the power management chip) generating a radio frequency signal is disposed in the first groove. In this way, the first insulation medium substrate can be disposed around the integrated circuit to protect the integrated circuit, and there is no need to perform a plastic packaging process. This avoids a warping problem caused by different thermal expansion coefficients of a plastic packaging material and the substrate, and reduces a risk of product failure. In addition, processing is convenient, which helps reduce costs and time, and can also reduce a weight and a volume. In addition, according to the antenna module that is provided in this application and that combines the flexible substrate and a rigid substrate (the insulation medium substrate), a quantity of layers of the flexible substrate is relatively small, an alignment effect is relatively good during bending, and signal coverage in more directions can be implemented. In addition, the antenna structure is disposed on the first insulation medium, and a thickness and/or a quantity of layers of the first insulation medium may be set based on a required antenna structure. Therefore, a shape of the antenna structure is not limited, and a gain and bandwidth of the antenna structure are not limited.

Other features and advantages of the present invention are described in detail in the following specific implementations.

BRIEF DESCRIPTION OF DRAWINGS

The following briefly describes accompanying drawings required for describing embodiments or a conventional technology.

DESCRIPTION OF EMBODIMENTS

The following describes technical solutions in embodiments of this application with reference to the accompanying drawings in embodiments of this application.

In descriptions of this application, orientations or position relationships indicated by terms "center", "up", "down", "front", "rear", "left", "right", "vertical", "horizontal", "top", "bottom", "inside", "outside", and the like are orientations or position relationships shown based on the accompanying drawings, and are merely intended to help describe this application and simplify the descriptions, but are not intended to indicate or imply that a mentioned apparatus or element needs to have a specific orientation or needs to be constructed and operated in a specific orientation. Therefore, these terms cannot be understood as a limitation on this application.

In the descriptions of this application, it should be noted that, unless otherwise specified and limited explicitly, terms "mount", "connect", and "connection" should be understood in a broad sense, for example, may be a fixed connection, may be a detachable connection, or may be an abutted connection or an integrated connection. Persons of ordinary skill in the art may understand specific meanings of the foregoing terms in this application based on a specific situation.

In the descriptions of this specification, the described specific features, structures, materials, or characteristics may be combined in a proper manner in any one or more of embodiments or examples.

Figure 1:
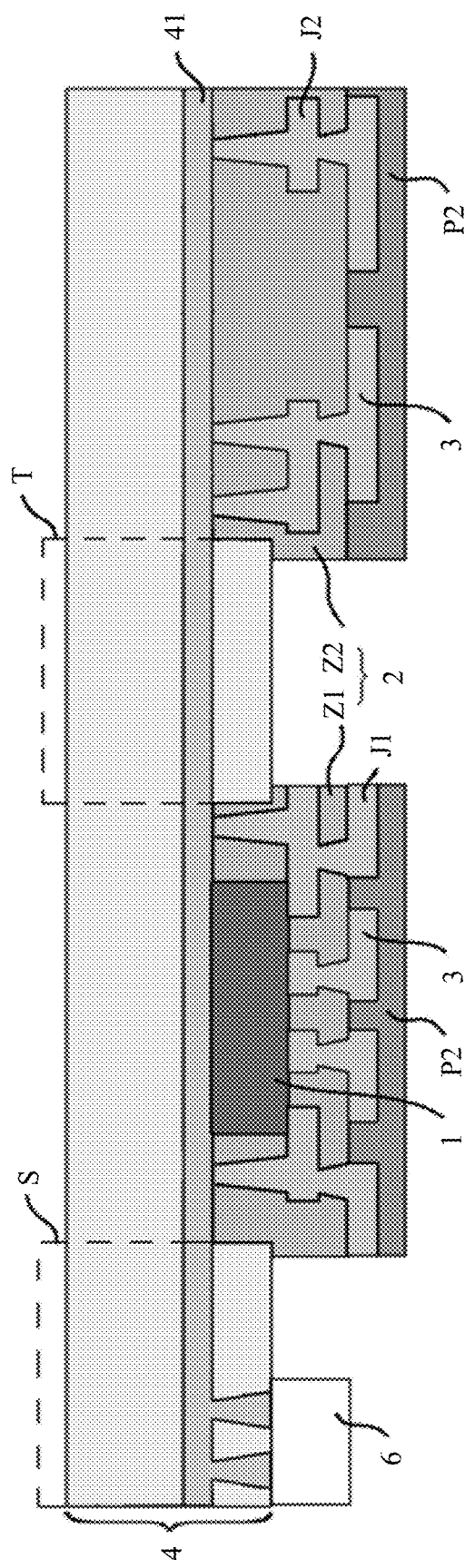
FIG. 1 is a schematic diagram of a simplified structure of an antenna module according to Embodiment 1 of the present invention.

FIG. 1 is a schematic diagram of a simplified structure of an antenna module according to Embodiment 1 of the present invention. As shown in FIG. 1, the antenna module includes an integrated circuit 1 configured to generate a radio frequency signal, a first insulation medium substrate 2, a flexible substrate 4, and an antenna structure 3. The first insulation medium substrate 2 includes a first section Z1 provided with a first groove and a second section Z2 spaced from the first section Z1. The integrated circuit 1 is disposed in the first groove. The flexible substrate 4 is stacked on the first insulation medium substrate 2. A middle part T that is of the flexible substrate 4 and that is located between the first section Z1 and the second section Z2 is bendable. The flexible substrate 4 includes a conductive structure 41. The antenna structure 3 includes a first metal structure J1 disposed in the first section Z1 and a second metal structure J2 disposed in the second section Z2. The first metal structure J1 is connected to the conductive structure 41 and the integrated circuit 1, and the second metal structure J2 is connected to the conductive structure 41. In other words, the first metal structure J1 may be directly connected to the integrated circuit 1, whereas the second metal structure J2 is indirectly connected to the integrated circuit 1 by connecting to the conductive structure 41 and the first metal structure J1, to radiate the radio frequency signal generated by the integrated circuit 1. The integrated circuit 1 may include at least one of a radio frequency chip and a power management chip. For example, the integrated circuit 1 may include the radio frequency chip. Alternatively, the integrated circuit 1 may include the radio frequency chip and the power management chip. In addition, the first insulation medium substrate 2 may be an insulation medium layer of a rigid substrate. A material of the first insulation medium substrate 2 may be a prepreg.

In the foregoing technical solutions, the first groove is provided on the first insulation medium substrate 2, and the integrated circuit 1 that generates a radio frequency signal is disposed in the first groove. In this way, the first insulation medium substrate 2 can be disposed around the integrated circuit 1 to protect the integrated circuit, and there is no need to perform a plastic packaging process. This avoids a warping problem caused by different thermal expansion coefficients of a plastic packaging material and the substrate, and reduces a risk of product failure. In addition, processing is convenient, which helps reduce costs and time. Specifically, the antenna module only needs to be processed in a substrate factory, and does not need to be transferred to a packaging factory for a packaging operation. This avoids transfer between factories, and can also reduce a weight and a volume.

In addition, in the solution in which the radio frequency chip is mounted on the flexible substrate and an antenna pattern is printed on the flexible substrate, when the flexible substrate is bent, signal coverage in more directions can be implemented. However, compared with a rigid substrate, the flexible substrate has strong constraints on both a thickness and a quantity of layers. To be specific, during bending, a relatively large thickness and/or a relatively large quantity of layers of the flexible substrate leads to failure of alignment. However, implementing a gain and bandwidth of the antenna has specific requirements on the thickness and the quantity of layers. As a result, both the gain and the bandwidth of the antenna are limited. According to the antenna module that is provided in this application and that combines the flexible substrate and the rigid substrate (the insulation medium substrate), a quantity of layers of the flexible substrate is relatively small, an alignment effect is relatively good during bending, and signal coverage in more directions can be implemented. In addition, the antenna structure is disposed on the first insulation medium, and a thickness and/or a quantity of layers of the first insulation medium may be set based on a required antenna structure. Therefore, a shape of the antenna structure is not limited, a gain and bandwidth of the antenna structure are not limited, and an antenna structure with a high gain can be fabricated.

Considering that a relatively large loss is caused when the radio frequency chip is connected to the substrate by using a solder ball, especially when the radio frequency chip is applied at a high frequency, there is a larger loss, which may severely affect a gain of the antenna. Therefore, in this application, the antenna structure 3 may be formed by plating copper on an outer surface and an interior of the first insulation medium substrate 2, and is connected to the integrated circuit 1. In this way, the antenna structure 3 is well connected to the integrated circuit 1 and the first insulation medium substrate 2, thereby reducing interconnection losses, improving conduction performance, implementing better signal transmission performance, and increasing product reliability. In addition, no additional cable or connecting member is required, thereby reducing a quantity of components, facilitating assembly, and helping reduce costs. Alternatively, the antenna structure 3 may be formed by etching a copper layer.

Still referring to FIG. 1, one end of the flexible substrate 4 may be disposed to extend out of the first section Z1, and an extended part S of the flexible substrate 4 is bendable. A connector 6 is connected to the conductive structure 41 at the extended part S. The connector 6 may be connected to structures such as a PCB board. In this way, when the middle part T of the flexible substrate 4 and the extended part S are bent, the first metal structure J1 and the second metal structure J2 that are used as the antenna structure 3 can face different directions, to cover different directions.

Figure 2:
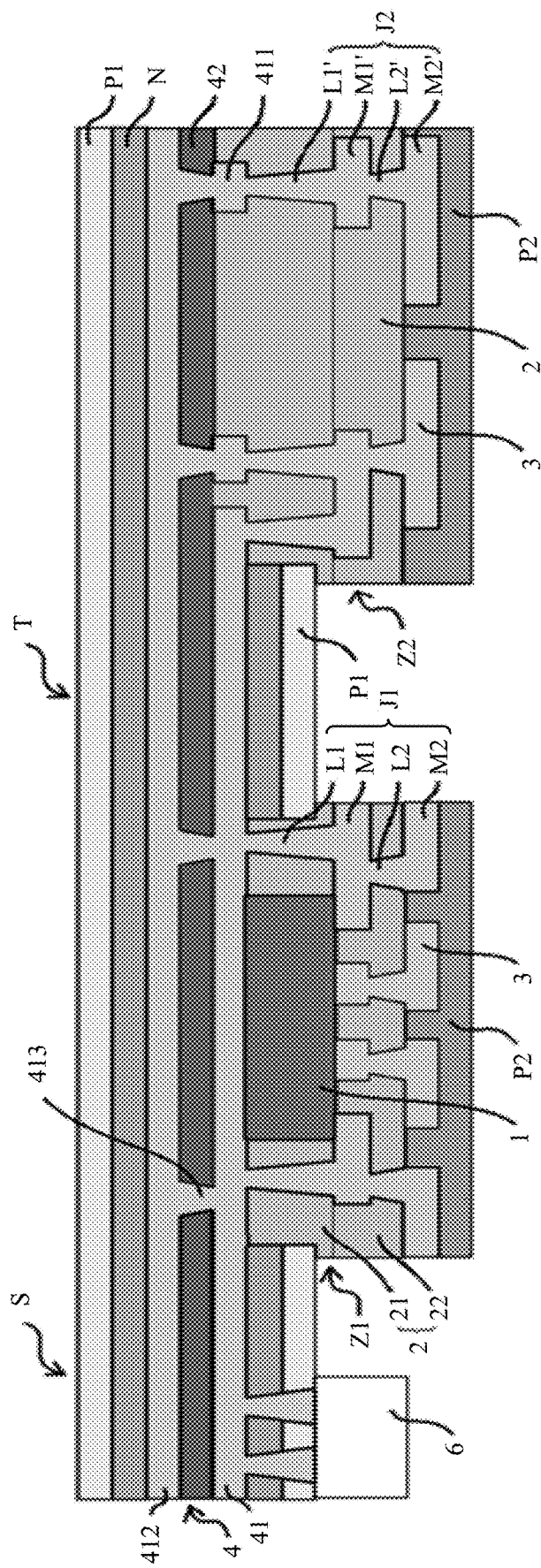
FIG. 2 is a schematic diagram of a detailed structure of an antenna module according to Embodiment 1 of the present invention.
Figure 4:
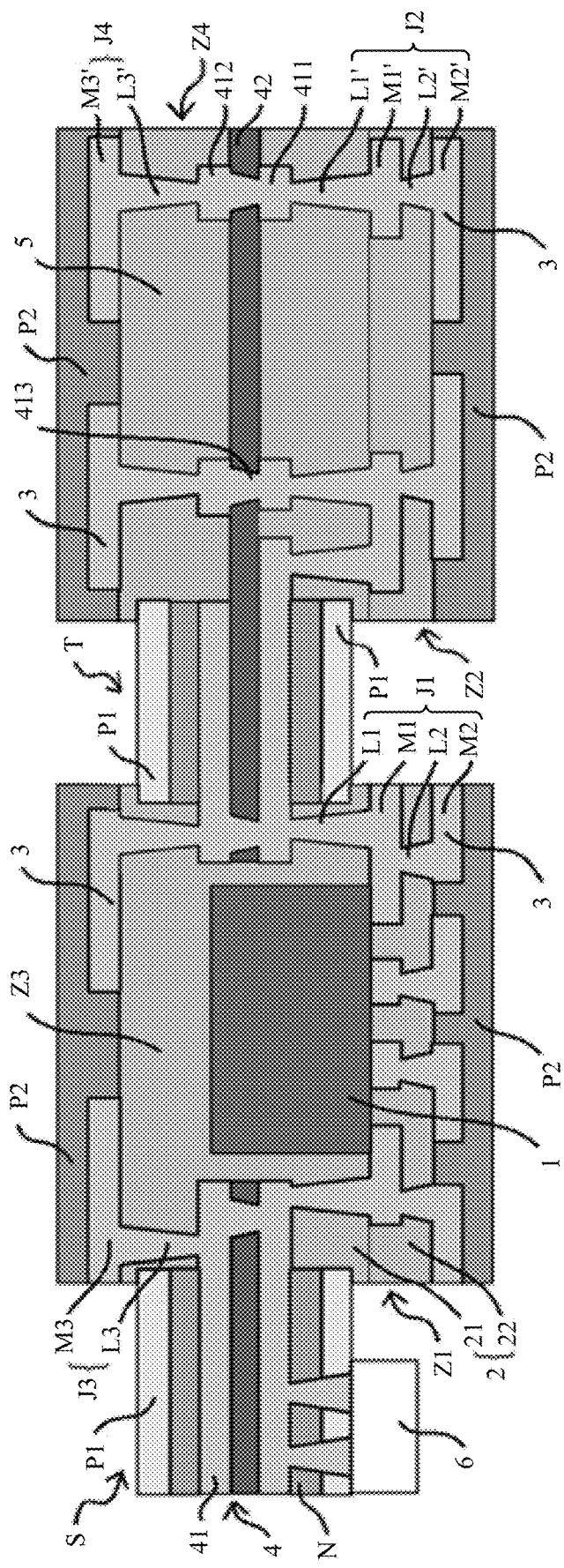
FIG. 4 is a schematic diagram of a detailed structure of an antenna module according to Embodiment 3 of the present invention.

FIG. 2 is a schematic diagram of a detailed structure of an antenna module according to Embodiment 1 of the present invention. As shown in FIG. 2, the flexible substrate 4 may further include a substrate film 42. The conductive structure 41 may include a first metal layer 411 and a second metal layer 412 disposed on both sides of the substrate film 42, and a connection metal layer 413 disposed through the substrate film 42. The connection metal layer 413 connects the first metal layer 411 and the second metal layer 412. In addition, a first protective layer P1 is disposed on an outer surface that is of the conductive structure 41 of the flexible substrate 4 and on which no other structure is stacked. Specifically, the first protective layer P1 may be a physical protective film, an electromagnetic shielding film, or the like, and may be bonded to the conductive structure 41 by using an adhesive N. When the first protective layer P1 is the electromagnetic shielding film, an electromagnetic shielding function may be implemented on the integrated circuit. In addition, the "other structure" herein may refer to the first section Z1 and the second section Z2 of the first insulation medium substrate 2, and a third section Z3 and a fourth section Z4 of a second insulation medium substrate 5 described below (as shown in FIG. 4). Further, to better protect the conductive structure 41 of the flexible substrate 4, the first protective layer P1 disposed on the outer surface of the bendable middle part T of the flexible substrate 4 separately overlaps with the first section Z1, the second section Z22, and the third section Z3 and the fourth section Z4 of the second insulation medium substrate 5 described below. Similarly, the first protective layer P1 disposed on an outer surface of the extended part S of the flexible substrate 4 mentioned above separately overlaps with the first section Z1 and the third section Z3 of the second insulation medium substrate 5 described below (as shown in FIG. 4).

Still referring to FIG. 2, the first insulation medium substrate 2 may include a first-layer substrate 21. A first groove and a first through hole are provided on the first-layer substrate 21. The first groove may penetrate the first-layer substrate 21 in a thickness direction. The first metal structure J1 may include a first metal layer M1 disposed on an outer surface of the first section Z1 of the first-layer substrate 21, and a first connection part L1 that is disposed in the first through hole and that connects the first metal layer M1 and the conductive structure 41 of the flexible substrate 4. In addition, the second metal structure J2 includes a first metal layer M1' disposed on an outer surface of the second section Z2 of the first-layer substrate 21, and a first connection part L1' that is disposed in the first through hole and that connects the first metal layer M1' and the conductive structure 41 of the flexible substrate 4. In this case, a pattern shape of the first metal layer M1 of the first metal structure J1 may be different from a pattern shape of the first metal layer M1' of the second metal structure J2. Correspondingly, a quantity of first connection parts L1 of the first metal structure J1 may be different from a quantity of first connection parts L1' of the second metal structure J2.

Optionally, the first insulation medium substrate 2 may further include a second-layer substrate 22 stacked on a side that is of the first-layer substrate 21 and that is away from the flexible substrate 4. The first metal layer M1 is disposed on the second-layer substrate 22, and a second through hole is disposed on the second-layer substrate 22. The first metal structure J1 further includes a second metal layer M2 disposed on an outer surface of the second-layer substrate 22, and a second connection part L2 that is disposed in the second through hole and that connects the second metal layer M2 and the first metal layer M1. In addition, the second metal structure J2 further includes a second metal layer M2' disposed on an outer surface of the second section Z2 of the second-layer substrate 22, and a second connection part L2' that is disposed in the second through hole and that connects the second metal layer M2' and the first metal layer M1'. In this case, a pattern shape of the second metal layer M2 of the first metal structure J1 may be different from a pattern shape of the second metal layer M2' of the second metal structure J2. Correspondingly, a quantity of second connection parts L2 of the first metal structure J1 may be different from a quantity of second connection parts L2' of the second metal structure J2.

In the foregoing solutions, the first metal structure J1 includes two metal layers M1 and M2 and two connection parts LI and L2. The second metal structure J2 includes two metal layers M1' and M2', and two connection parts LI' and L2'. It may be understood that, when needed, the first metal structure J1 and the second metal structure J2 may further include more metal layers and connection parts connecting adjacent metal layers.

In addition, to better protect the antenna module, as shown in FIG. 2, a second protective layer P2 is disposed on outer surfaces that are of the first metal structure J1, the second metal structure J2, and the first insulation medium substrate 2 and that are away from the flexible substrate 4. The second protective layer P2 may be a green paint.

Figure 3:
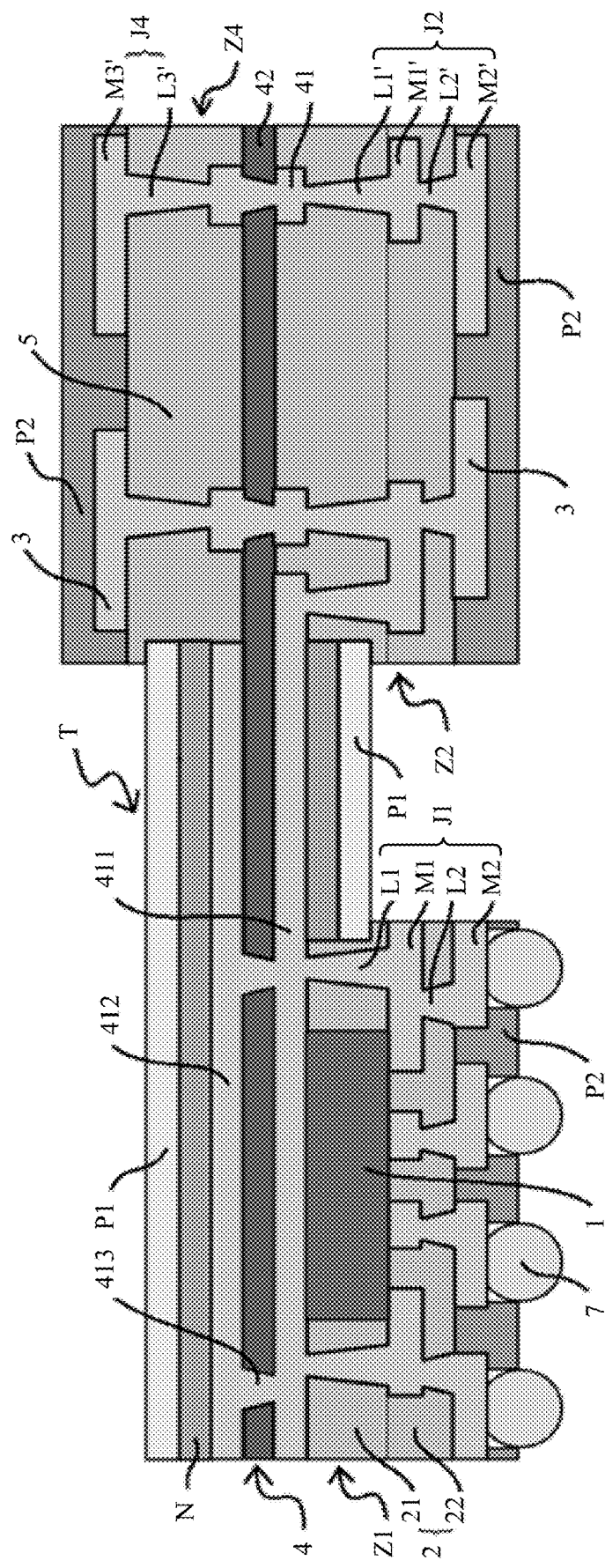
FIG. 3 is a schematic diagram of a detailed structure of an antenna module according to Embodiment 2 of the present invention.

FIG. 3 is a schematic diagram of a detailed structure of an antenna module according to Embodiment 2 of the present invention. As shown in FIG. 3, a slot for exposing a part of the first metal structure J1 is provided on the second protective layer P2. Solder 7 connected to the exposed first metal structure J1 is disposed in the slot, so that the solder 7 is welded to structures such as a PCB board. The solder 7 may be tin or nickel. In this case, one end of the flexible substrate 4 is disposed without extension out of the first section Z1 (the two are flush with each other).

FIG. 4 is a schematic diagram of a detailed structure of an antenna module according to Embodiment 3 of the present invention. As shown in FIG. 4, when a thickness of the integrated circuit 1 is relatively large, for example, the integrated circuit 1 includes a radio frequency chip and a power management chip that are stacked with each other, optionally, a second groove is provided on the flexible substrate 4, the second groove is arranged opposite to the first groove, and the integrated circuit 1 is disposed in the first groove and the second groove. The second groove may penetrate the flexible substrate 4.

Further, to dispose as many antenna structures as possible, the antenna module may further include the second insulation medium substrate 5 disposed on a side that is of the flexible substrate 4 and that is away from the first insulation medium substrate 2. The second insulation medium substrate 5 may include the fourth section Z4 disposed corresponding to the second section Z2. A fourth metal structure J4 connected to the conductive structure 41 of the flexible substrate 4 is disposed on the fourth section Z4. The antenna structure 3 further includes the fourth metal structure J4, as shown in FIG. 3. Optionally, the second insulation medium substrate 5 may further include a third section Z3 disposed corresponding to the first section Z1. A third metal structure J3 connected to the conductive structure 41 of the flexible substrate 4 is disposed on the third section Z3. The antenna structure 3 further includes a third metal structure J3, as shown in FIG. 4. Certainly, the second insulation medium substrate 5 may alternatively include only the third region Z3, and the third metal structure J3 is disposed on the third region Z3.

Still referring to FIG. 4, a third through hole is provided on the second insulation medium substrate 5. The third metal structure J3 includes a third metal layer M3 located on an outer surface of the third section Z3 of the second insulation medium substrate 5, and a third connection part L3 that is disposed in the third through hole and that connects the third metal layer M3 and the conductive structure 41 of the flexible substrate 4. In addition, the fourth metal structure J4 includes a third metal layer M3' located on an outer surface of the fourth section Z4 of the second insulation medium substrate 5, and a third connection part L3' that is disposed in the third through hole and that connects the third metal layer M3' and the conductive structure 41 of the flexible substrate 4.

In addition, to better protect the antenna module, a second protective layer P2 is disposed on outer surfaces that are of the third metal structure J3 and/or the fourth metal structure J4, and the second insulation medium substrate 5 and that are away from the flexible substrate 4.

Figure 5:
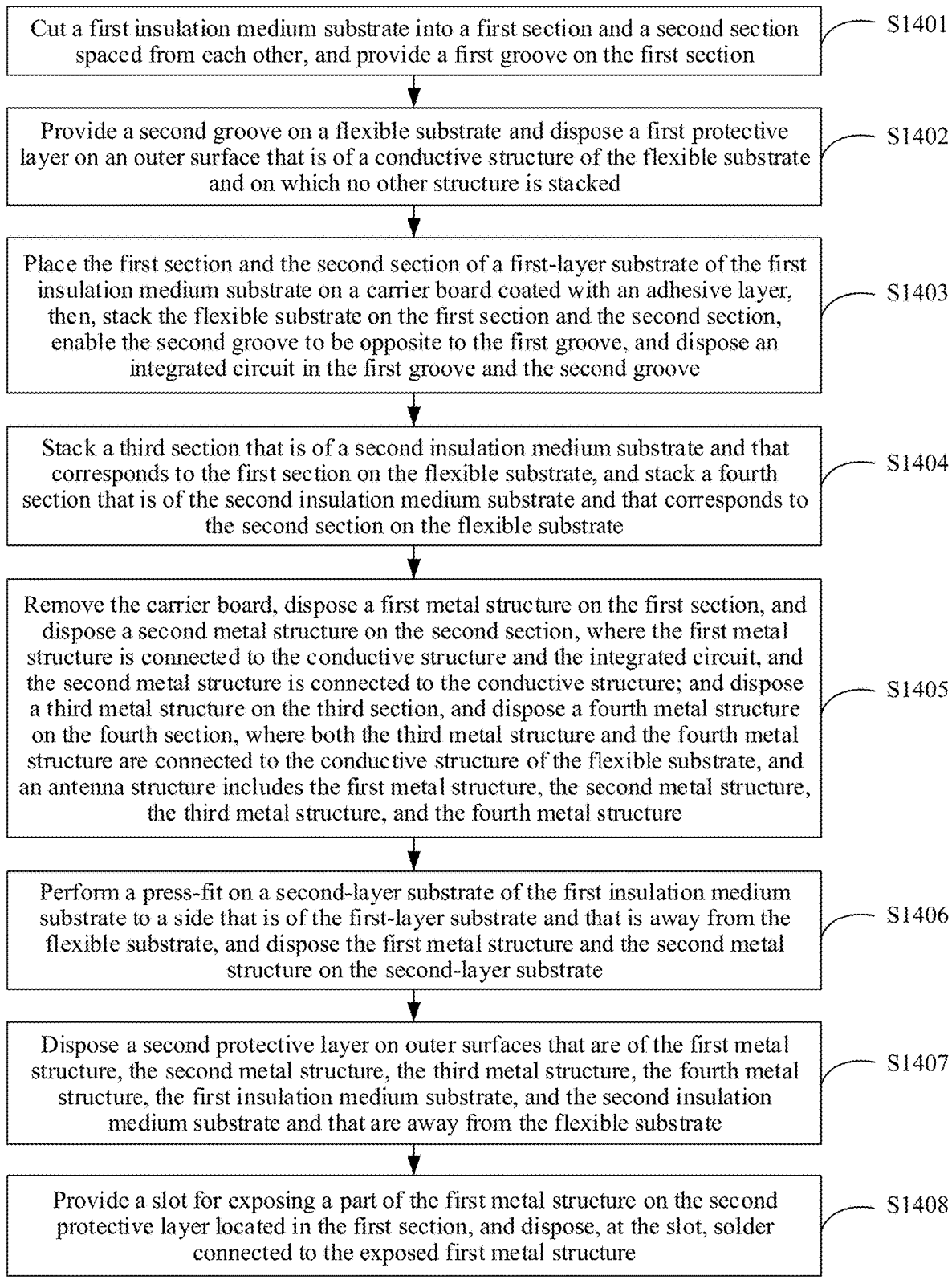
FIG. 5 is a flowchart of an antenna module manufacturing method according to Embodiment 4 of the present invention.

FIG. 5 is a flowchart of an antenna module manufacturing method according to Embodiment 4 of the present invention. FIG. 6 to FIG. 14 are process diagrams of an antenna module manufacturing method according to Embodiment 4 of the present invention. A sequence of steps may be adjusted based on a work requirement. In addition, a procedure of an antenna module manufacturing method in Embodiment 1, Embodiment 2, and Embodiment 3 of the present invention is similar to that shown in FIG. 5, and details are not described herein. As shown in FIG. 5, the antenna module manufacturing method in Embodiment 4 may specifically include the following steps.

Figure 6:
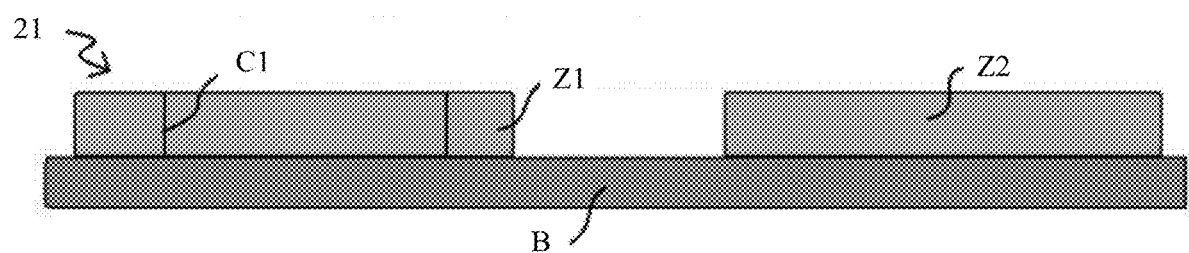
FIG. 6 to FIG. 14 are process diagrams of an antenna module manufacturing method according to Embodiment 4 of the present invention.

Step S1401: Cut a first-layer substrate 21 of a first insulation medium substrate 2 into a first section Z1 and a second section Z2 spaced from each other, and provide a first groove C1 on the first section Z1, as shown in FIG. 6.

Figure 7:
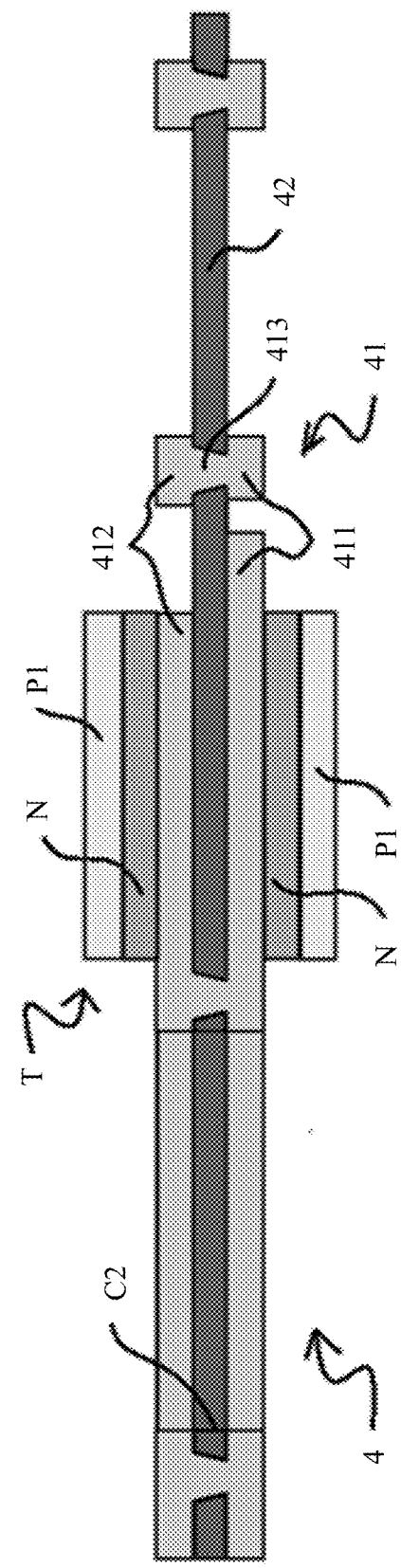

Step S1402: Provide a second groove C2 on a flexible substrate 4 and dispose a first protective layer P1 on an outer surface that is of a conductive structure 41 of the flexible substrate 4 and on which no other structure is stacked, as shown in FIG. 7. For example, the protective layer P1 is disposed in a bendable middle part T. In addition, the second groove C2 may penetrate the flexible substrate 4 in a thickness direction. In addition, the flexible substrate 4 may include a substrate film 42. The conductive structure 41 may include a first metal layer 411 and a second metal layer 412 disposed on both sides of the substrate film 42, and a connection metal layer 413 disposed through the substrate film 42. The connection metal layer 413 connects the first metal layer 411 and the second metal layer 412. Further, the first metal layer 411 and the second metal layer 412 may be disposed as different pattern shapes based on a work requirement.

Figure 8:
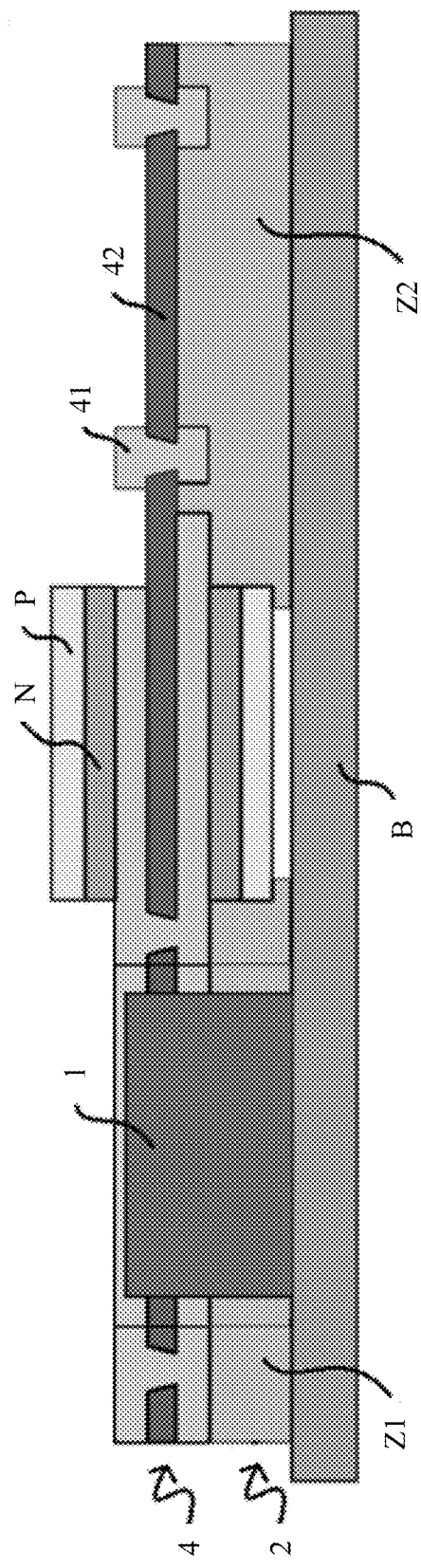

Step S1403: Place the first section Z1 and the second section Z2 of the first-layer substrate 21 of the first insulation medium substrate 2 on a carrier board B coated with an adhesive layer, then, stack the flexible substrate 4 on the first section Z1 and the second section Z2, enable the second groove C2 to be opposite to the first groove C1, and dispose an integrated circuit 1 in the first groove C1 and the second groove C2, as shown in FIG. 8. In this way, the first insulation medium substrate 2 and the flexible substrate 4 can be disposed around the integrated circuit 1, to protect the integrated circuit, and there is no need to perform a plastic packaging process. This avoids a warping problem caused by different thermal expansion coefficients of a plastic packaging material and the substrate, and reduces a risk of product failure. In addition, processing is convenient, which helps reduce costs and time. In addition, the adhesive layer coated on the carrier board B can fix the integrated circuit 1.

Further, when the flexible substrate 4 is stacked on the first insulation medium substrate 2, the first protective layer P1 disposed on the opposite outer surface of the bendable middle part T of the flexible substrate 4 may overlap with the first section Z1 and the second section Z2, so that connection reliability between the two is relatively high, and the conductive structure of the flexible substrate 4 can be better protected.

Figure 9:
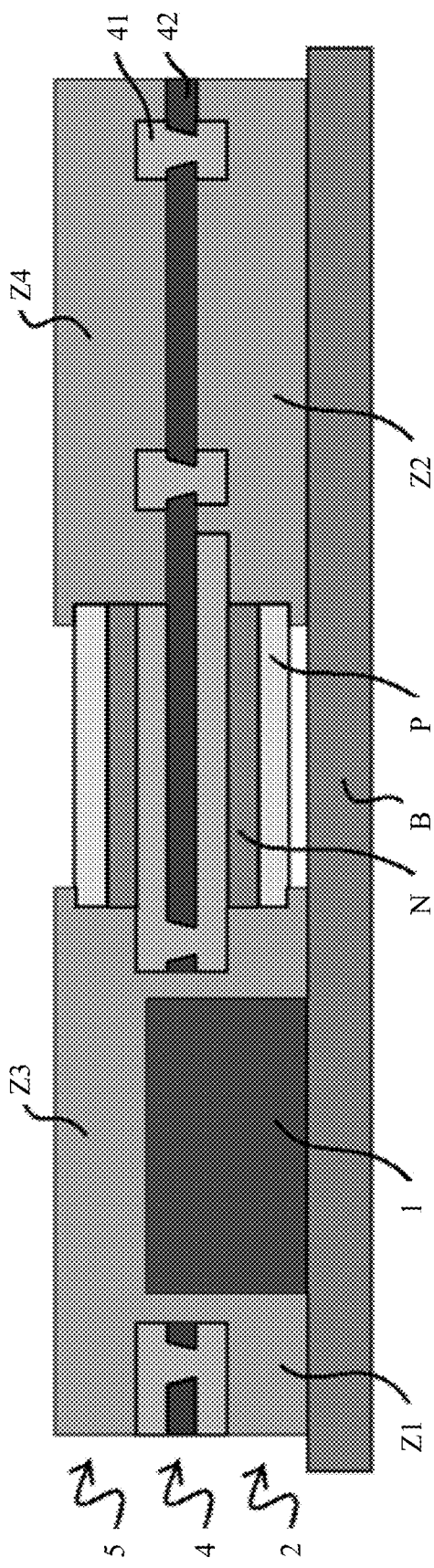

Step S1404: Stack a third section Z3 that is of a second insulation medium substrate 5 and that corresponds to the first section Z1 on the flexible substrate 4, and stack a fourth section Z4 that is of the second insulation medium substrate 5 and that corresponds to the second section Z2 on the flexible substrate 4, as shown in FIG. 9. The third section Z3 and the fourth section Z4 overlap with the first protective layer P1 that is disposed on the opposite outer surface of the middle part T of the flexible substrate 4.

Figure 10:
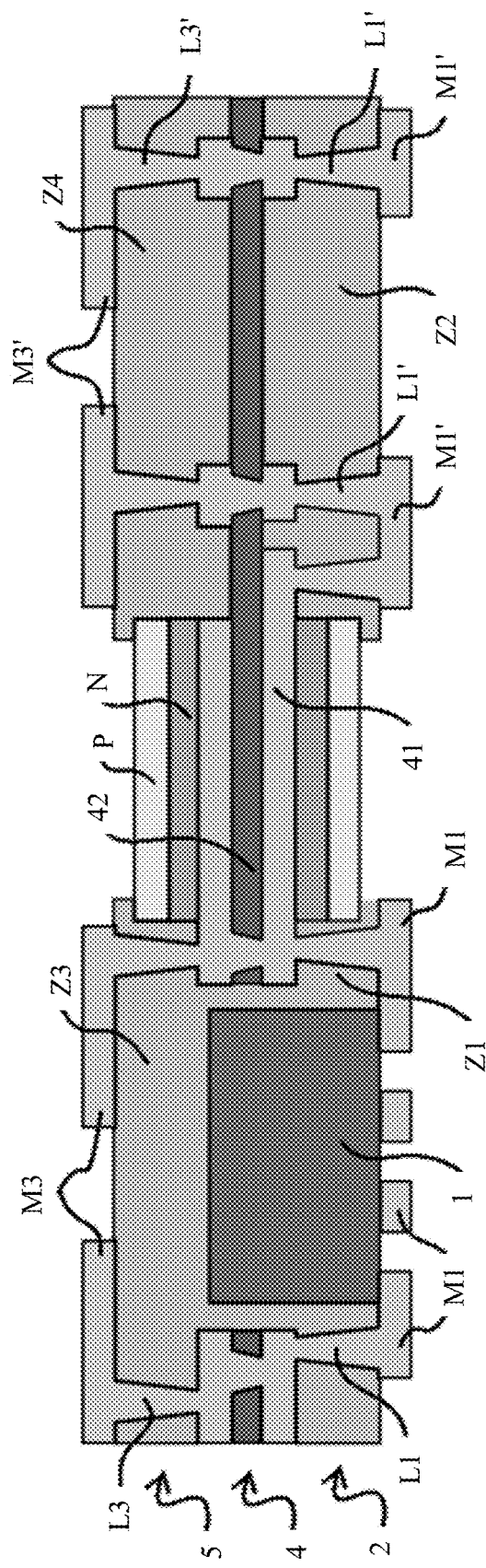

Step S1405: Remove the carrier board B, dispose a first metal structure J1 on the first section Z1, and dispose a second metal structure J2 on the second section Z2, where the first metal structure J1 is connected to the conductive structure 41 and the integrated circuit 1, and the second metal structure J2 is connected to the conductive structure 41; and dispose a third metal structure J3 on the third section Z3, and dispose a fourth metal structure J4 on the fourth section Z4, where both the third metal structure J3 and the fourth metal structure J4 are connected to the conductive structure 41 of the flexible substrate 4, and an antenna structure 3 includes the first metal structure J1, the second metal structure J2, the third metal structure J3, and the fourth metal structure J4, as shown in FIG. 10. A part of the antenna structure 3 may be formed by using steps of laser perforation, sputtering a seed layer, photoresist coating, exposure, development, electroplating, etching, and the like.

When the middle part T that is of the flexible substrate 4 and that is located between the first section Z1 and the second section Z2 is bent, the second metal structure J2 and the fourth metal structure J4 that are used as the antenna structure 3 can cover different directions.

Optionally, the first metal structure J1 and the second metal structure J2 are formed by plating copper on an outer surface and an interior of the first insulation medium substrate 2. The first metal structure J1 is connected to the integrated circuit 1 when the first metal structure J1 is formed by plating copper. In this way, the integrated circuit 1 is well connected to the antenna structure 3, thereby improving conduction performance, and helping reduce interconnection losses. The third metal structure J3 and the fourth metal structure J4 may be alternatively formed by plating copper on an outer surface and an interior of the second insulation medium substrate 5.

Specifically, when the first metal structure J1 is disposed on the first section Z1 and the second metal structure J2 is disposed on the second section Z2, a first through hole may be first disposed on the first-layer substrate 21 of the first insulation medium substrate 2. Next, a first metal layer M1 is disposed on an outer surface of the first section Z1 of the first-layer substrate 21, and a first connection part L1 that connects the first metal layer M1 and the conductive structure 41 is disposed in the first through hole. The first metal structure J1 includes the first metal layer M1 and the first connection part L1. In addition, a first metal layer M1' is disposed on an outer surface of the second section Z2 of the first-layer substrate 21, and a first connection part L that connects the first metal layer M1' and the conductive structure 41 is disposed in the first through hole. The second metal structure J2 includes the first metal layer M1' and the first connection part L1'.

Similarly, when the third metal structure J3 is disposed on the third section Z3 and the fourth metal structure J4 is disposed on the fourth section Z4, a third through hole may be first provided on the second insulation medium substrate 5. Next, a third metal layer M3 is disposed on an outer surface of the third section Z3 of the second insulation medium substrate 5, and a third connection part L3 that connects the third metal layer M3 and the conductive structure 41 of the flexible substrate 4 is disposed in the third through hole. The third metal structure J3 includes the third metal layer M3 and the third connection part L3. In addition, a third metal layer M3' is disposed on an outer surface of the fourth section Z4 of the second insulation medium substrate 5, and a third connection part L3' that connects the third metal layer M3' and the conductive structure 41 of the flexible substrate 4 is disposed in the third through hole. The fourth metal structure J4 includes the third metal layer M3' and the third connection part L3'.

Figure 11:
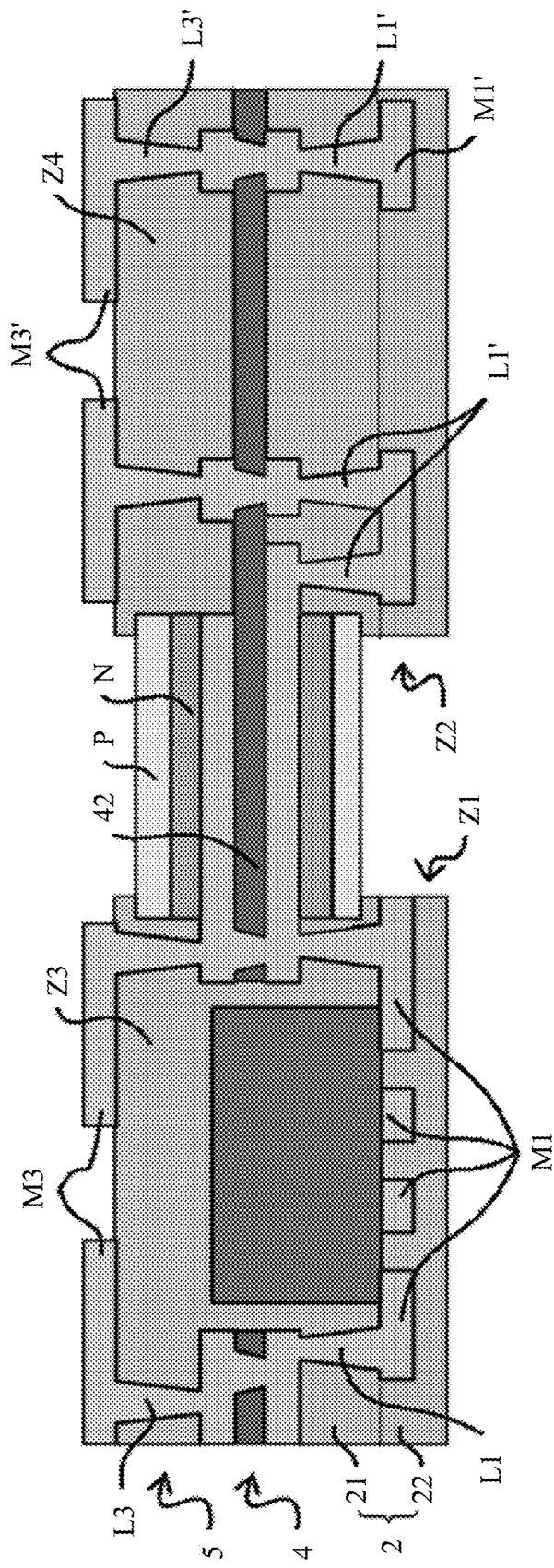
Figure 12:
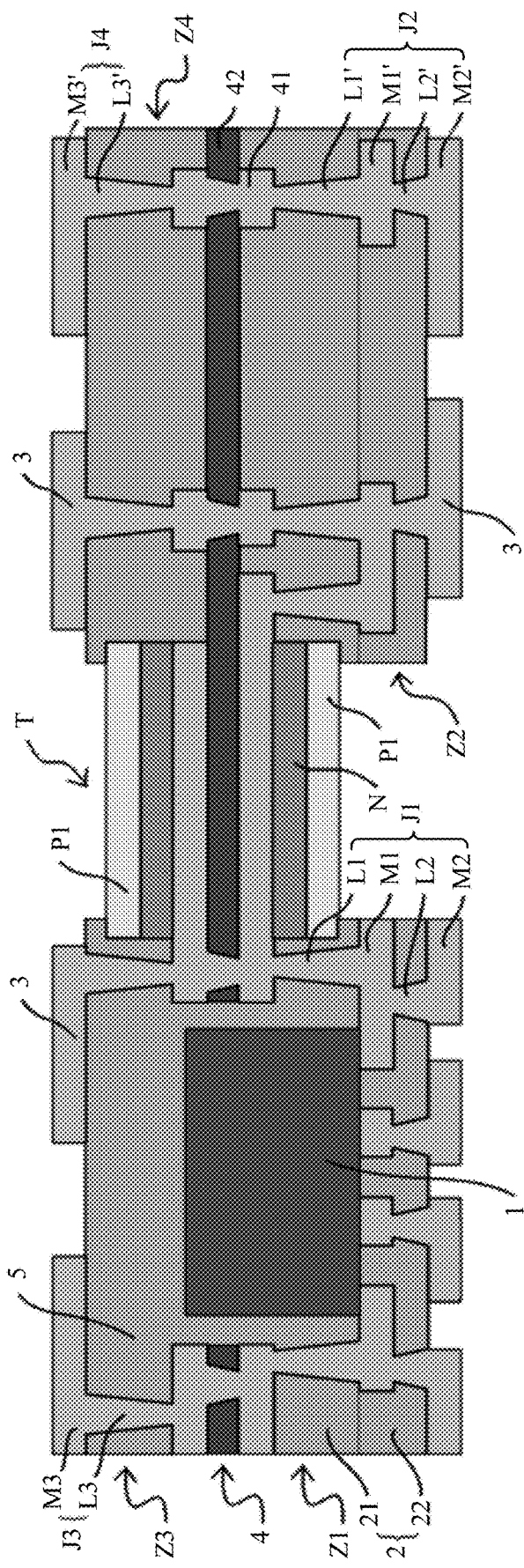

Step S1406: Perform a press-fit on a second-layer substrate 22 of the first insulation medium substrate 2 to a side that is of the first-layer substrate 21 and that is away from the flexible substrate 4, and dispose the first metal structure J1 and the second metal structure J2 on the second-layer substrate 22, as shown in FIG. 11 and FIG. 12. Specifically, a second through hole may be first provided on the second-layer substrate 22 of the first insulation medium substrate 2. Next, a second metal layer M2 is disposed on the outer surface of the first section Z1 of the second-layer substrate 22, and a second connection part L2 that connects the first metal layer M1 and the second metal layer M2 is disposed in the second through hole. The first metal structure J1 further includes the second metal layer M2 and the second connection part L2. In addition, a second metal layer MT is disposed on the outer surface of the second section Z2 of the second-layer substrate 22, and a second connection part L2' that connects the first metal layer M1' and the second metal layer M2' is disposed in the second through hole. The second metal structure J2 further includes the second metal layer M2' and the second connection part L2'.

It should be noted that, the foregoing describes only a case in which the first insulation medium substrate 2 includes one layer of substrate and two layers of substrates, and the second insulation medium substrate 5 includes one layer of substrate. It may be understood that, the first insulation medium substrate 2 and the second insulation medium substrate 5 may further include more layers of substrates. Specifically, quantities of layers of the first insulation medium substrate 2 and the second insulation medium substrate 5 may be selected based on a shape of the antenna structure 3 that needs to be disposed.

Figure 13:
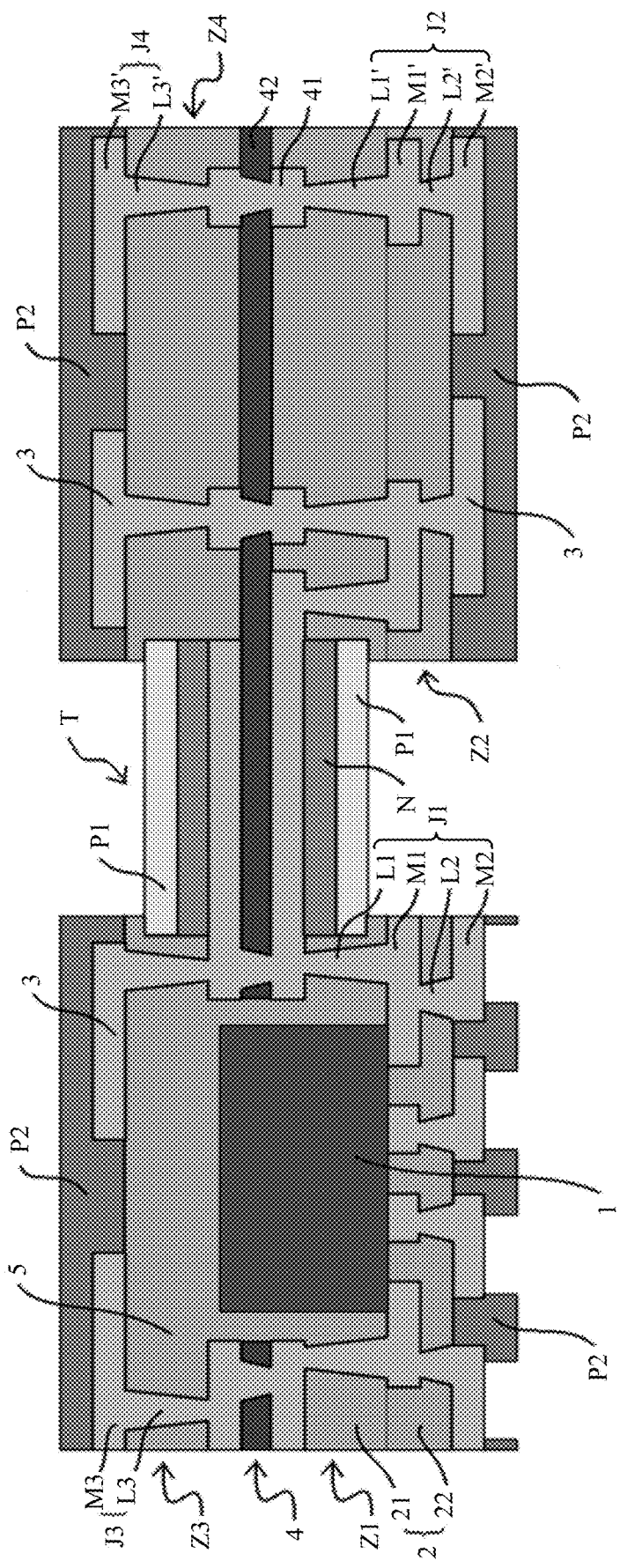

Step S1407: Dispose a second protective layer P2 on outer surfaces that are of the first metal structure J1, the second metal structure J2, the third metal structure J3, the fourth metal structure J4, the first insulation medium substrate 2, and the second insulation medium substrate 5 and that are away from the flexible substrate 4, as shown in FIG. 13, to better protect the antenna module. The second protective layer P2 may be a green paint.

Figure 14:
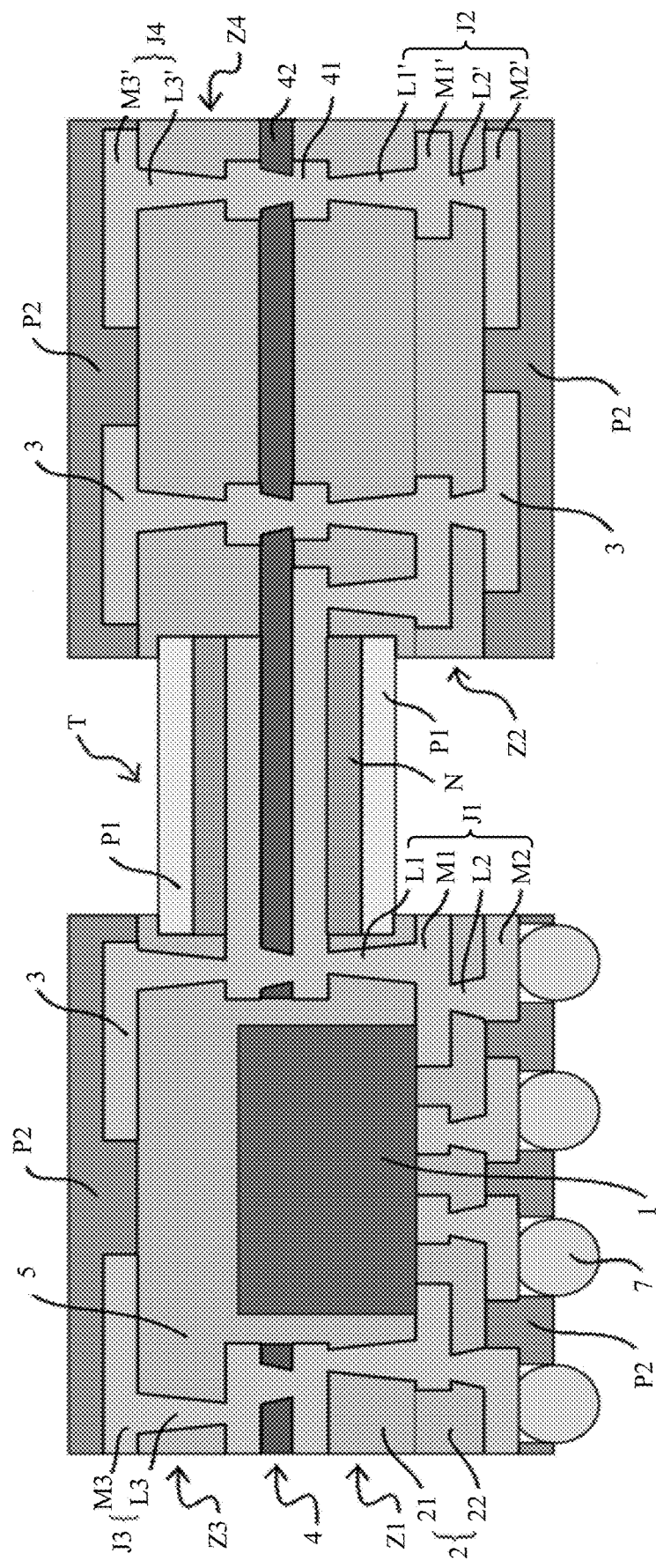

Step S1408: Provide a slot for exposing a part of the first metal structure J1 on the second protective layer P2 located in the first section Z1, and dispose, at the slot, solder 7 connected to the exposed first metal structure J1, as shown in FIG. 14. FIG. 14 is a schematic diagram of a detailed structure of an antenna module according to Embodiment 4 of the present invention. The solder 7 connected to the first metal structure J1 may be, for example, tin or nickel, and may be used to connect to structures such as a PCB board. In this case, one end of the flexible substrate 4 is disposed without extension out of the first section Z1, but the two are flush with each other. The first metal structure J1 may be configured to only conduct but not to radiate a signal. However, in FIG. 4, one end of the flexible substrate 4 is disposed to extend out of the first section Z1. A connector 6 is disposed on the conductive structure 41 at an extended part S, so as to connect to structures such as a PCB board. The first metal structure J1 is not connected to the solder 7. In this case, the first metal structure J1 may be configured to radiate a signal.

In addition, an embodiment of the present invention further provides an electronic device, and the electronic device includes the antenna module in the foregoing embodiments. Because the electronic device includes the antenna module, the electronic device has all or at least some of the advantages of the foregoing antenna module.

Finally, it should be noted that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. An antenna module, wherein the antenna module comprises:
   an integrated circuit, configured to generate a radio frequency signal;
   a first insulation medium substrate, comprising a first section provided with a first groove and a second section spaced from the first section, wherein the integrated circuit is disposed in the first groove;
   a flexible substrate, stacked on the first insulation medium substrate, wherein a middle part that is of the flexible substrate and that is located between the first section and the second section is bendable, and the flexible substrate comprises a conductive structure; and
   an antenna structure, comprising a first metal structure disposed on the first section and a second metal structure disposed on the second section, wherein the first metal structure is connected to the conductive structure and the integrated circuit, and the second metal structure is connected to the conductive structure.

2. The antenna module according to claim 1, wherein the antenna structure is formed by plating copper on an outer surface and an interior of the first insulation medium substrate, such that the copper is connected to the integrated circuit.

3. The antenna module according to claim 1, wherein a second groove is provided on the flexible substrate, the second groove is arranged opposite to the first groove, and the integrated circuit is disposed in the first groove and the second groove.

4. The antenna module according to claim 1, wherein:
   the flexible substrate further comprises a substrate film,
   the conductive structure comprises a first metal layer and a second metal layer disposed on both sides of the substrate film, and a connection metal layer disposed through the substrate film, and
   the connection metal layer connects the first metal layer and the second metal layer.

5. The antenna module according to claim 1, wherein a first protective layer is disposed on an outer surface of the conductive structure of the flexible substrate and on which no other structure is stacked.

6. The antenna module according to claim 1, wherein:
   the first insulation medium substrate comprises a first-layer substrate, and the first groove and a first through hole are provided on the first-layer substrate;
   the first metal structure comprises a first metal layer disposed on an outer surface of the first section of the first-layer substrate, and a first connection part that is disposed in the first through hole and that connects the first metal layer and the conductive structure of the flexible substrate; and
   the second metal structure comprises the first metal layer disposed on an outer surface of the second section of the first-layer substrate, and a first connection part that is disposed in the first through hole and that connects the first metal layer and the conductive structure of the flexible substrate.

7. The antenna module according to claim 6, wherein:
   the first insulation medium substrate comprises a second-layer substrate stacked on a side that is of the first-layer substrate and that is away from the flexible substrate, the first metal layer is disposed on the second-layer substrate, and a second through hole is provided on the second-layer substrate;
   the first metal structure further comprises a second metal layer disposed on the outer surface of the first section of the second-layer substrate, and a second connection part that is disposed in the second through hole and that connects the second metal layer and the first metal layer; and
   the second metal structure further comprises the second metal layer disposed on the outer surface of the second section of the second-layer substrate, and a second connection part that is disposed in the second through hole and that connects the second metal layer and the first metal layer.

8. The antenna module according to claim 1, wherein the antenna module comprises a second insulation medium substrate disposed on a side that is of the flexible substrate and that is away from the first insulation medium substrate, and the second insulation medium substrate comprises:
   a third section facing the first section, wherein a third metal structure connected to the conductive structure of the flexible substrate is disposed on the third section, and the antenna structure further comprises the third metal structure; or
   a fourth section facing the second section, wherein a fourth metal structure connected to the conductive structure of the flexible substrate is disposed on the fourth section, and the antenna structure further comprises the fourth metal structure.

9. The antenna module according to claim 8, wherein a third through hole is provided on the second insulation medium substrate;
   the third metal structure comprises a third metal layer located on an outer surface of the third section of the second insulation medium substrate, and a third connection part that is disposed in the third through hole and that connects the third metal layer and the conductive structure of the flexible substrate; or
   the fourth metal structure comprises a third metal layer located on an outer surface of the fourth section of the second insulation medium substrate, and a third connection part that is disposed in the third through hole and that connects the third metal layer and the conductive structure of the flexible substrate.

10. The antenna module according to claim 8, wherein a second protective layer is disposed on outer surfaces that are of the third metal structure or the fourth metal structure, and the second insulation medium substrate, and that are away from the flexible substrate.

11. The antenna module according to claim 1, wherein a second protective layer is disposed on outer surfaces that are of the first metal structure, the second metal structure, and the first insulation medium substrate, and that are away from the flexible substrate.

12. The antenna module according to claim 11, wherein a slot for exposing a part of the first metal structure is provided on the second protective layer, and solder connected to the exposed first metal structure is disposed in the slot.

13. The antenna module according to claim 1, wherein one end of the flexible substrate is disposed to extend out of the first section, an extended part of the flexible substrate is bendable, and a connector is connected to the conductive structure at the extended part.

14. The antenna module according to claim 1, wherein the integrated circuit comprises at least one of a radio frequency chip and a power management chip.

15. An electronic device, comprising an antenna module, wherein the antenna module comprises:
   an integrated circuit, configured to generate a radio frequency signal;
   a first insulation medium substrate, comprising a first section provided with a first groove and a second section spaced from the first section, wherein the integrated circuit is disposed in the first groove;
   a flexible substrate, stacked on the first insulation medium substrate, wherein a middle part that is of the flexible substrate and that is located between the first section and the second section is bendable, and the flexible substrate comprises a conductive structure; and
   an antenna structure, comprising a first metal structure disposed on the first section and a second metal structure disposed on the second section, wherein the first metal structure is connected to the conductive structure and the integrated circuit, and the second metal structure is connected to the conductive structure.

16. An antenna module manufacturing method, wherein the manufacturing method comprises:
   cutting a first insulation medium substrate into a first section and a second section spaced from each other, and providing a first groove on the first section;
   disposing an integrated circuit in the first groove;
   stacking a flexible substrate with a conductive structure on the first section and the second section; and
   disposing a first metal structure on the first section and disposing a second metal structure on the second section, such that the first metal structure is connected to the conductive structure and the integrated circuit, the second metal structure is connected to the conductive structure, and an antenna structure comprises the first metal structure and the second metal structure.

17. The antenna module manufacturing method according to claim 16, wherein the manufacturing method comprises:
   before New stacking a flexible substrate on the first section and the second section, providing a second groove on the flexible substrate, and disposing a first protective layer on an outer surface that is of the conductive structure of the flexible substrate and on which no other structure is stacked; and
   during the stacking a flexible substrate on the first section and the second section, placing the integrated circuit in the first groove and the second groove, wherein the second groove is opposite the first groove.

18. The antenna module manufacturing method according to claim 16, further comprising plating copper on an outer surface and an interior of the first insulation medium substrate to form an antenna structure connected to the integrated circuit.

19. The antenna module manufacturing method according to claim 16, wherein the manufacturing method comprises:
   stacking a third section that is of the second insulation medium substrate and that corresponds to the first section on the flexible substrate, and disposing a third metal structure on the third section, wherein the third metal structure is connected to the conductive structure of the flexible substrate, and the antenna structure further comprises the third metal structure; or
   stacking a fourth section that is of the second insulation medium substrate and that corresponds to the second section on the flexible substrate, and disposing a fourth metal structure on the fourth section, wherein the fourth metal structure is connected to the conductive structure of the flexible substrate, and the antenna structure further comprises the fourth metal structure.

20. The antenna module manufacturing method according to claim 19, wherein the manufacturing method comprises: disposing a second protective layer on outer surfaces that are of the third metal structure and/or the fourth metal structure, and the second insulation medium substrate and that are away from the flexible substrate.

* * * * *